US009892923B2

(12) United States Patent
Dekkers et al.

(10) Patent No.: US 9,892,923 B2
(45) Date of Patent: Feb. 13, 2018

(54) METHOD FOR TUNING THE EFFECTIVE WORK FUNCTION OF A METAL

(71) Applicant: IMEC VZW, Leuven (BE)

(72) Inventors: Hendrik F. W. Dekkers, Tienen (BE); Lars-Ake Ragnarsson, Leuven (BE); Tom Schram, Rixensart (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 14/757,811

(22) Filed: Dec. 22, 2015

(65) Prior Publication Data

US 2016/0196976 A1    Jul. 7, 2016

(30) Foreign Application Priority Data

Dec. 22, 2014  (EP) ..................... 14199689

(51) Int. Cl.
*H01L 21/28* (2006.01)
*H01L 21/8238* (2006.01)
(Continued)

(52) U.S. Cl.
CPC .................. *H01L 21/28088* (2013.01); *H01L 21/823842* (2013.01); *H01L 29/4966* (2013.01); *H01L 29/517* (2013.01); *H01L 29/66795* (2013.01)

(58) Field of Classification Search
CPC .............. H01L 21/2141; H01L 21/048; H01L 21/02175; H01L 21/845; H01L 21/8238; H01L 27/1211; H01L 27/1104; H01L 29/435; H01L 29/66795; H01L 51/0508; H01L 29/4966; H01L 29/517; H01L 21/28088; H01L 21/823842; C23C 16/45553; C23C 16/277

USPC ........ 257/288, 350, 760, 751, 753; 438/197, 438/199, 775, 778, 787, 786, 791, 683, 438/585
See application file for complete search history.

(56) References Cited

U.S. PATENT DOCUMENTS 6,444,513 B1    9/2002  Besser et al.
6,815,285 B2    11/2004 Choi et al.
(Continued)

OTHER PUBLICATIONS

Cheng et al. "Work function tuning of the Ti x TayN metal gate electrode for advanced metal-oxide-semiconductor devices applications," 2007 Applied Physics Letters 90, 062144-1-3.
(Continued)

*Primary Examiner* — Marcos D Pizarro
*Assistant Examiner* — Antonio Crite
(74) *Attorney, Agent, or Firm* — Knobbe, Martens, Olson & Bear LLP

(57) ABSTRACT

The disclosed technology generally relates to integrated circuit devices and methods of forming the same, and more particularly to metal electrodes whose effective work function can be tuned. In one aspect, a method of forming a metal electrode of a semiconductor structure includes providing a semiconductor substrate having at least a region covered with a dielectric. The semiconductor substrate is introduced into a chamber configured for atomic layer deposition (ALD). A metal for the metal electrode is deposited at least on the dielectric by performing an ALD cycle. Performing the ALD cycle includes pulsing a Ti-containing precursor gas followed by pulsing a Ta-containing precursor gas, and further includes pulsing $NH_3$ gas.

18 Claims, 12 Drawing Sheets

(51) Int. Cl.
  *H01L 29/49* (2006.01)
  *H01L 29/51* (2006.01)
  *H01L 29/66* (2006.01)

(56) References Cited

U.S. PATENT DOCUMENTS

| | | | | |
|---|---|---|---|---|
| 6,967,154 | B2* | 11/2005 | Meng | C23C 16/45542 |
| | | | | 438/622 |
| 7,041,335 | B2* | 5/2006 | Chung | C23C 16/34 |
| | | | | 257/E21.171 |
| 7,129,580 | B1* | 10/2006 | Londergan | H01L 21/28562 |
| | | | | 257/751 |
| 8,642,468 | B2 | 2/2014 | Ganguli et al. | |
| 9,029,253 | B2* | 5/2015 | Milligan | H01L 29/4908 |
| | | | | 257/388 |
| 9,082,702 | B2* | 7/2015 | Lei | H01L 21/28008 |
| 2012/0153406 | A1 | 6/2012 | Park et al. | |
| 2013/0221445 | A1 | 8/2013 | Lei et al. | |
| 2013/0292676 | A1* | 11/2013 | Milligan | H01L 29/4908 |
| | | | | 257/57 |
| 2013/0307126 | A1* | 11/2013 | Chiang | H01L 29/4966 |
| | | | | 257/635 |

OTHER PUBLICATIONS

European Search Report dated Jun. 9, 2015 in European Application No. 14199689.2.

Ragnarsson et al., "Highly scalable bulk FinFET Devices with Multi-VT options by conductive metal gate stack tuning for the 10-nm node and beyond," Energy Efficiency Convention (SAEEC), 2012 Southern African, IEEE, Jun. 9, 2014, p. 1-2.

Tang et al., "Integration of Advanced MOSFET Device with Dual Effective Band Edge Work Function Metals Using Both HK and MG Last Scheme," ECS Transactions, vol. 61 No. 2, Mar. 24, 2014, p. 253-259.

Xueli, Ma et al., "An effective work-function tuning method of nMOSCAP with high-k/metal gate by TiN/TaN double-layer stack thickness," Journal of Semiconductors, vol. 35, No. 9, Sep. 2014, 6 pages.

Xueli, Ma et al., "The effects of process condition of top-TiN and TaN thickness on the effective work function of MOSCAP with high-k/metal gate stacks," Journal of Semiconductors, vol. 35 No. 10, Oct. 1, 2014, p. 106002.

* cited by examiner

METHOD FOR TUNING THE EFFECTIVE WORK FUNCTION OF A METAL

CROSS-REFERENCE TO RELATED APPLICATIONS

This application claims foreign priority to European application EP 14199689.2, filed Dec. 22, 2014, the content of which is incorporated by reference herein in its entirety.

BACKGROUND

Field

The disclosed technology generally relates to integrated circuit devices and methods of forming the same, and more particularly to metal electrodes whose effective work function can be tuned

Description of the Related Technology

The scaling of feature sizes in complementary metal oxide semiconductor technology (CMOS) in an effort to keep up with Moore's Law has necessitated the replacement of polysilicon-SiO$_2$ gate stacks to overcome short channel effects. To achieve this goal high dielectric constant, high-k, gate dielectrics in combination with metal gate electrodes have been proposed. Candidate metal gates should present appropriate effective work function (EWF) values when deposited on high-k gate dielectric materials to be used for n-MOS (4.0 eV-4.4 eV) or p-MOS (4.8-5.2 eV) devices, respectively. Tuning the EWF of candidate metal gates for use within P-MOS and within n-MOS devices has received great attention and has been successfully implemented by using different techniques.

TiN is one of these candidate gate metals that provide suitable EWF (~4.8 eV) for p-MOS devices operating at a low threshold voltage ($V_T$). When a thin TiN layer is covered with layer of Al and/or Al alloy, such as Ti$_q$Al$_{1-q}$, the EWF of this layer stack shifts down and becomes suitable for n-MOS devices.

For scaling of some technologies, it is desirable for the TiN layer to be as thin as possible. Current target for a typical thickness of TiN is 2 nm. Two major problems exist for n-MOS devices having a stack of Ti$_q$Al$_{1-q}$ on TiN. One of these problems is related to the fact that the EWF also reduces with the thickness of TiN. For 2 nm TiN, the EWF is already low enough for n-MOS devices, hence the EWF should not be further scaled down. The second problem is the leakage current through the gate dielectric which increases with decreasing thickness of TiN. This increase in gate leakage current is likely to be due to the Al penetration from the Ti$_q$Al$_{1-q}$ layer through the TiN layer into the high-k gate dielectric. Forming 1 nm TaN on top of 1 nm TiN copes with this gate leakage problem. However, this solution does not improve the more-than-desired reduction of EWF value.

There is, therefore, a need in the art for tuning the EWF of a metal electrode containing Ti deposited on the gate dielectric within the gate stack of a MOS device. There is also a need to reduce the gate leakage current of such a gate stack.

SUMMARY OF CERTAIN INVENTIVE ASPECTS

It is an object of embodiments of the present disclosure to provide methods for tuning the effective work function of a metal electrode containing Ti on a dielectric of a semiconductor structure. It is an object of embodiments of the present disclosure to provide a semiconductor structure comprising a metal electrode containing Ti on a dielectric with a tuned effective work function of the metal electrode.

The above objective is accomplished by a method and a device according to the present disclosure.

In a first aspect, the present disclosure relates to a method for tuning the effective work function of a metal on a dielectric of a semiconductor structure. The method comprises providing a semiconductor structure. This semiconductor structure comprises a semiconductor substrate. This semiconductor structure comprises at least a region covered with a dielectric. This semiconductor structure is brought into an Atomic Layer Deposition (ALD) chamber. In this ALD chamber, a metal is deposited at least on this dielectric by performing an ALD cycle. This ALD cycle comprises pulsing with a Ti-containing precursor gas and another pulsing with NH$_3$ gas. This ALD cycle further comprises yet another pulsing with a Ta-containing precursor gas. This metal is an electrode.

This Ti-containing precursor gas may be TiCl$_4$, TiF$_4$, TiBr$_4$ or a metal-organic precursor of Ti. Preferably, this Ti-containing precursor gas is TiCl$_4$.

This Ta-containing precursor gas may be TaCl$_5$, TaF$_5$, TaBr$_5$ or a metal-organic precursor of Ta. Preferably, this Ta-containing precursor gas is TaCl$_5$.

It is an advantage of embodiments of this disclosure that pulsing with a Ta-containing precursor gas within this ALD cycle incorporates Ta in this metal during the deposition of this metal. This provides a further advantage to use this method for providing a conformal deposition of this metal, which makes it suited for manufacturing a (field effect) transistor (FET), particularly for manufacturing FinFETs or tri-gate FETs or Gate-All around FETs.

It is advantage of embodiments of this disclosure that by incorporating Ta in this metal, gate leakage is reduced. Optionally a TaN layer can be used to further reduce the gate leakage.

It is further an advantage of embodiments of this disclosure that EWF can be tuned by the thickness of this metal. A similar value of EWF to that obtained by the conventional TiN/TaN stack can be obtained by providing this metal at a lower thickness. This is particularly an advantage for future scaling of feature sizes in CMOS technology.

In alternative embodiments, NH$_3$ gas may be replaced by N$_2$H$_4$ or N$_2$/H$_2$ gas.

In an embodiment, this metal electrode may be deposited directly on and in contact with this dielectric.

In alternative embodiments, a TiN layer may be sandwiched in between and in contact with this metal electrode and this dielectric.

In embodiments, this dielectric may be a dielectric stack comprising at least a layer of a dielectric material having a dielectric constant higher than SiO$_2$. This dielectric material is referred to as a high-k dielectric material. This metal electrode is deposited on this high-k dielectric material.

In an embodiment, this metal electrode may be deposited directly on and in contact with this high-k dielectric material.

In an alternative embodiment, a TiN layer may be sandwiched in between and in contact with this metal and this high-k dielectric material.

In embodiments, this dielectric stack may further comprise an interfacial layer that is sandwiched and in contact with said dielectric material and said semiconductor structure.

In an embodiment, this interfacial layer may, for example, be SiO$_2$ or a SiO$_2$-like layer. The thickness of this interfacial layer is in the range of 0.5 nm to 4 nm. Preferably, the thickness is between 0.5 nm to 1 nm.

In embodiments, this semiconductor structure is a metal-oxide-semiconductor (MOS) device. This MOS device may be a MOS capacitor or a MOS (field effect) transistor. This MOS device may be an n-channel MOS (field effect) transistor or a p-channel MOS (field effect) transistor. This n-channel MOS (field effect) transistor is also referred to as an n-MOS device and this p-channel MOS (field effect) transistor is also referred to as a p-MOS device.

In a particular embodiment, this MOS device is a n-MOS device and this metal electrode is the gate electrode of this n-MOS device and the method further comprises providing, on this metal electrode, an Al comprising metal.

In this particular embodiment, preferably this Al comprising metal may be provided directly on and in contact with this metal electrode of this n-MOS device.

In this particular embodiments, alternatively a TaN layer may be sandwiched in between and in contact with this metal electrode of this n-MOS device and this Al comprising metal.

In an embodiment, this Al comprising metal is an alloy of Ti and Al. Preferably, this alloy is Ti$_q$Al$_{1-q}$. q is between 0%-90%. Preferably, q is between 20%-70%. More preferably, q is between 25% to 40%.

In embodiments, a thermal anneal may be performed after providing this Al-comprising metal. This thermal anneal may be performed at a temperature in the range of 200° C. to 600° C. Preferably this temperature range is 400° C. to 450° C. The duration of this thermal anneal depends on the Ta percentage in the metal electrode and on the Al percentage in the Ti$_q$Al$_{1-q}$ layer. Preferably, the duration of this thermal anneal is in the range of 2 minutes to 1 hour.

In an alternative embodiment, this MOS device is a p-MOS device and this metal electrode is the gate electrode of this p-MOS device.

In this alternative embodiment, a TaN layer may be present directly on this metal electrode of this p-MOS device.

In embodiments, this ALD cycle is performed at a temperature in the range of 200° C. to 550° C. In some embodiments, this ALD cycle is performed at a temperature range of 400° C. to 500° C.

It is an advantage of embodiments of this disclosure that this temperature range provides a suitable thermal budget within CMOS processing without eventually leading to the formation of reliability or performance issues of this MOS device. Furthermore, pulsing with this Ta-containing precursor gas within this ALD cycle occurs in the same pressure and temperature range as pulsing with this Ti-containing precursor gas. This allows for ease of manufacturability without requiring further temperature or pressure adjustments after pulsing with this Ti-containing precursor gas and prior to pulsing with this Ta-containing precursor gas.

In embodiments, a pressure in the range of 1 Torr to 25 Torr may be chosen.

In embodiments, this ALD cycle is repeated for a predetermined number of times. Repeating this ALD cycle for this predetermined number of times determines the (final) thickness of this metal. The thickness of this metal is in the range of 0.5 nm to 3.0 nm (nanometer). Preferably, the thickness of this metal is in the range of 1.5 nm to 2.0 nm.

In some embodiments, this ALD cycle comprises or consists of a first sub-cycle and a second sub-cycle.

In these some embodiments, this ALD cycle is initiated by performing this first sub-cycle. This first sub-cycle comprises or consists of a first unit cycle and this first unit cycle is repeated for a first number of times. Performing this first unit cycle comprises a pulsing with this Ti-containing precursor gas and a pulsing with this NH$_3$ gas.

This second sub-cycle comprises or consists of a second unit cycle and this second unit cycle is repeated for a second number of times. Performing this second unit cycle comprises pulsing with this Ta-containing precursor gas and pulsing with this NH$_3$ gas.

In an embodiment, pulsing with NH$_3$ gas is done after pulsing with the Ti-containing precursor gas within this first unit cycle and after pulsing with the Ta-containing precursor gas within this second unit cycle.

In an embodiment, this first sub-cycle may be performed prior to performing this second sub-cycle.

In an alternative embodiment, this second sub-cycle may be performed prior to performing this first sub-cycle.

It is an advantage of some of the disclosed embodiments of this disclosure that the percent Ta content of this metal can be tuned by adjusting this second number of times with respect to this first number of times. By tuning the percent Ta content of this metal, EWF of this metal can be tuned towards a value suitable for this n-MOS device.

In alternative embodiments, this ALD cycle comprises or consists of a single unit cycle. Performing this single unit cycle comprises pulsing with this Ti-containing precursor gas and this Ta-containing precursor gas. In these alternative embodiments, performing this single unit cycle comprises pulsing with this Ti-containing precursor gas before pulsing with this Ta-comprising precursor gas. In these alternative embodiments, pulsing with NH3 gas is done only after pulsing with Ta comprising precursor gas.

In a second aspect, this disclosure relates to a MOS device. This MOS device comprises a semiconductor structure. This semiconductor structure comprises a semiconductor substrate. This semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium. A dielectric is present at least on a region of this semiconductor structure. A metal electrode is present on this dielectric. This metal electrode is a Ti$_x$Ta$_y$N$_z$ layer with x+y+z=1 and 0<x,y,z<1 and x+y=0.5, where x, y, z refer to atomic percentages. This metal electrode has a thickness between about 1 nm and about 5 nm, between about 1 nm and about 3 nm, for instance about 2 nm and has a Ta percentage in the range of 5 at. % and 45 at. %.

In some embodiments, this metal electrode may be deposited directly on and in contact with this dielectric.

In alternative embodiments, a TiN layer may be sandwiched in between and in contact with this metal electrode and this dielectric.

In embodiments, this dielectric may be a dielectric stack 2,3. In embodiments, this dielectric comprises at least a layer of a dielectric material 3 having a dielectric constant higher than of SiO$_2$. This dielectric material is referred to as a high-k dielectric material. This metal electrode is deposited on this high-k dielectric material.

In some embodiments, this metal electrode may be deposited directly on and in contact with this high-k dielectric material.

In alternative embodiments, a TiN layer may be sandwiched in between and in contact with this metal and this high-k dielectric material.

In embodiments, this MOS device is a n-MOS device whereby this metal electrode is a gate electrode and this MOS device further comprises an Al comprising metal on this gate electrode. This Al comprising metal can be an alloy of Ti and Al. Such an alloy is preferably $Ti_qAl_{1-q}$.

In embodiments, preferably, this Al-comprising metal may be provided directly on and in contact with this metal electrode of this n-MOS device.

In embodiments, alternatively, a TaN layer may be sandwiched in between and in contact with this metal electrode and this Al comprising metal of this n-MOS device.

In alternative embodiments, this MOS device is a p-MOS device and this metal electrode is a gate electrode.

In these alternative embodiments, a TaN layer may be present directly on this metal electrode of this p-MOS device.

In an embodiment, this n-MOS device is comprised in an integrated circuit. This integrated circuit can further comprise such a p-MOS device.

In an embodiment, this multi-gate FET may be a FinFET. This multi-gate FET may be a tri-gate transistor. This multi-gate FET may be a gate-all-around transistor.

In a third aspect, this disclosure relates to a method for fabricating a dual work function metal gate in a semiconductor structure.

The method comprises providing a semiconductor structure. This semiconductor structure may be a field effect transistor (FET) or an intermediate structure in the fabrication of this FET. This intermediate structure may comprise a dummy metal gate or a replacement metal gate.

This semiconductor structure comprises a substrate on which the field effect transistor is formed. This semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium.

This semiconductor structure comprises a first region and a second region. Each of this first region and second region is covered with a dielectric. This dielectric can be a dielectric stack comprising at least a layer 3 of a dielectric material having a dielectric constant higher than $SiO_2$.

This first region comprises a first dopant. This first region may be an n-MOS device region and this first dopant may be phosphorus or arsenic. This second region comprises a second dopant. This second region may be a p-MOS device region and this second dopant may be boron (B). Hence, this semiconductor structure can comprise an n-MOS device and a p-MOS device.

Next, this semiconductor structure is brought into an atomic layer deposition (ALD) chamber. A metal is deposited on this dielectric by performing an ALD cycle. Preferably, this metal is deposited directly on and in contact with this dielectric. Depositing this metal by ALD is advantageous because a conformal metal layer with reliable thickness control can be achieved.

This ALD cycle comprises pulsing with a Ti-containing precursor gas and another pulsing with $NH_3$ gas. This Ti-containing precursor gas may be $TiCl_4$, $TiF_4$, $TiBr_4$ or a metal-organic precursor of Ti. Preferably, this Ti-containing precursor gas is $TiCl_4$. This ALD cycle further comprises yet another pulsing with a Ta-containing precursor gas. This Ta-containing precursor gas may be $TaCl_5$, $TaF_5$, $TaBr_5$ or a metal-organic precursor of Ta. Preferably, this Ta containing precursor gas is $TaCl_5$.

This metal is an electrode. Preferably this electrode is a gate electrode.

Alternatively, a TiN layer may be provided on this dielectric prior to depositing this metal.

Next, an Al-comprising metal is provided on this metal electrode. This Al-comprising metal can be an alloy of Ti and Al. Preferably, this alloy is $Ti_qAl_{1-q}$.

Alternatively, a TaN layer may be provided on this metal prior to providing this Al-comprising metal.

Next, this Al-comprising metal is selectively removed from this second region. That is selectively removing $Ti_qAl_{1-q}$ from this p-MOS region. Selectively removing $Ti_xAl_{1-x}$ from this p-MOS region comprises depositing a photoresist over this semiconductor structure. Following a lithographic patterning process, this photoresist is retained only on this n-MOS region, thereby exposing this p-MOS region. Thereafter, $Ti_qAl_{1-q}$ is removed from this exposed p-MOS region. Stripping this photoresist exposes this $Ti_qAl_{1-q}$ in this n-MOS region.

In embodiments, this dielectric may be a dielectric stack. In embodiments, this dielectric comprises at least a layer of a dielectric material having a dielectric constant higher than $SiO_2$. In some embodiments, this deposited metal electrode is in contact with this layer of dielectric material.

In a fourth aspect, this disclosure relates to a dual work function metal gate field effect transistor (FET). This FET comprises a semiconductor structure. This semiconductor structure comprises a semiconductor substrate. This semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium. This FET comprises a first region comprising a first dopant and a second region comprising a second dopant. A dielectric is present overlying both of this first region and this second region. This dielectric may be a dielectric stack 2,3. This dielectric preferably comprises at least a layer 3 of a dielectric material having a dielectric constant higher than $SiO_2$. This dielectric material is referred to as a high-k dielectric material.

A metal electrode is present on this dielectric. This metal electrode is a $Ti_xTa_yN_z$ layer with $x+y+z=1$ and $0<x,y,z<1$ and $x+y=0.5$, where x, y, z refer to atomic percentages. This electrode has a thickness of about 1 to about 3 nm, for instance about 2 nm and has a Ta percentage in the range of 5 at. % and 45 at. %.

In some embodiments, this high-k dielectric material is in contact with this metal electrode.

In alternative embodiments, a TiN layer is sandwiched in between and in contact with this metal electrode and this high-k dielectric material.

An Al-comprising metal is present on this metal electrode only on said first region.

In alternative embodiments, a TaN layer is present directly on this metal electrode both in this first region and in this second region.

In embodiments, this first region is an n-MOS device region.

In embodiments, this second region is a p-MOS device region.

In embodiments, this Al-comprising metal is an alloy of Ti and Al.

Preferably, this alloy is $Ti_qAl_{1-q}$.

In embodiments, this first dopant may be phosphorus or arsenic and this second dopant may be boron (B). Concentration of this first and/or second dopant is adjusted to be suitable depending on the technology.

DETAILED DESCRIPTION OF CERTAIN ILLUSTRATIVE EMBODIMENTS

Figure 1:
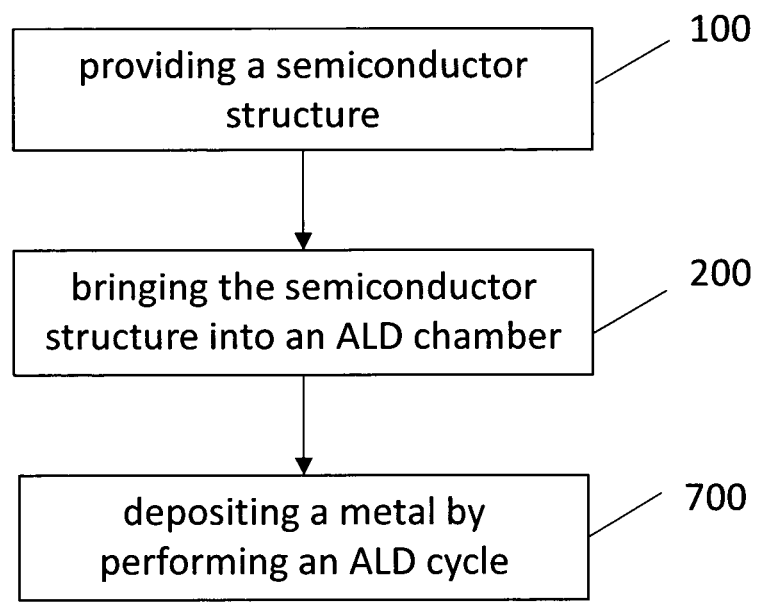
FIG. 1 is a flowchart illustrating a method of forming a metal layer according to an embodiment.

The present disclosure will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions may not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein and unless provided otherwise, the term "n-MOS device" refers to an n-channel field effect transistor (n-FET).

As used herein and unless provided otherwise, the term "p-MOS device" refers to a p-channel field effect transistor (p-FET).

As used herein and unless provided otherwise, the term "unit cycle" refers to an atomic layer deposition (ALD) sequence comprising or consisting of processes of pulsing, separately, with precursor gases and pulsing with a purge gas in between these precursor gases.

As used herein and unless provided otherwise, the term "sub-cycle" refers to an ALD sequence comprising or consisting of several unit cycles repeated for a predetermined number of times. A combination of 2 or more sub-cycles makes up an ALD cycle. This combined ALD cycle may be called an ALD super-cycle.

As used herein and unless provided otherwise, the term "equivalent oxide thickness (EOT)" refers to a thickness of SiO$_2$ that would be needed to obtain the same gate capacitance as the capacitance obtained using an insulator other than $SiO_2$ that has a dielectric constant that is different, e.g., higher than that of $SiO_2$.

FIG. 1 is a flowchart illustrating a method of depositing a metal, according to an embodiment of the present disclosure.

The method 800 starts with providing 100 a semiconductor structure. The semiconductor structure comprises a semiconductor substrate. The semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium. The semiconductor structure comprises at least a region covered with a dielectric. The dielectric may be a dielectric stack 2,3 (FIGS. 8, 11, 12) that comprises at least a layer of a dielectric material 3 having a dielectric constant higher than of $SiO_2$, e.g., a high-k dielectric material 3.

Thereafter, the semiconductor structure is introduced 200 into a chamber, e.g., a chamber configured for atomic layer deposition (ALD). In the (ALD) chamber, a metal comprising titanium is deposited 700 at least on the dielectric 3 by performing an ALD cycle. The deposited metal can be an electrode layer, which can be further processed, e.g., patterned, to form an electrode, e.g., a gate electrode. In some embodiments, an ALD cycle comprises pulsing a Ti-containing precursor gas and pulsing with $NH_3$ gas. Pulsing with the Ti-containing precursor gas and $NH_3$ gas leads to the formation of titanium nitride under some circumstances. Thus, a titanium nitride metal electrode layer is formed. Preferably, this titanium nitride metal is TiN.

Figure 8:
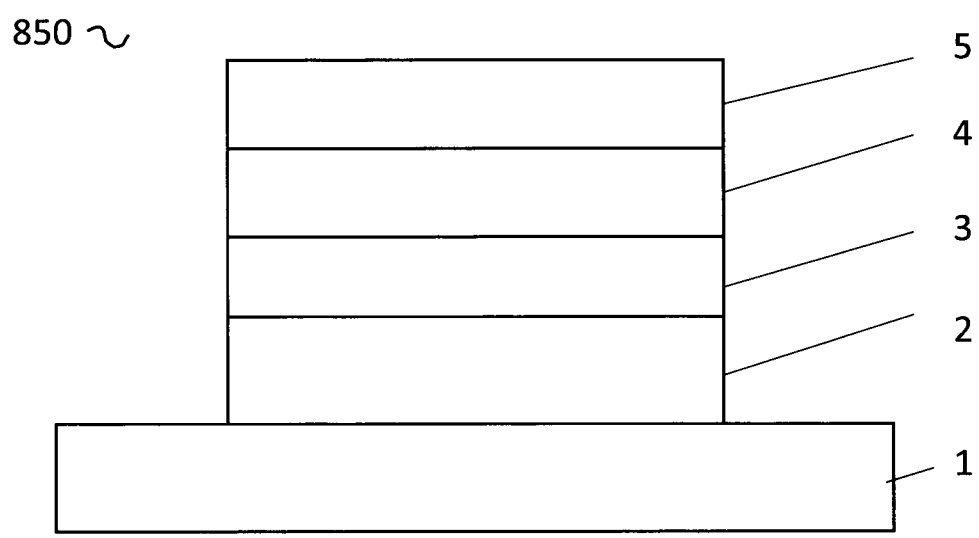
FIG. 8 illustrates a schematic n-MOS device, according to an embodiment.
Figure 11:
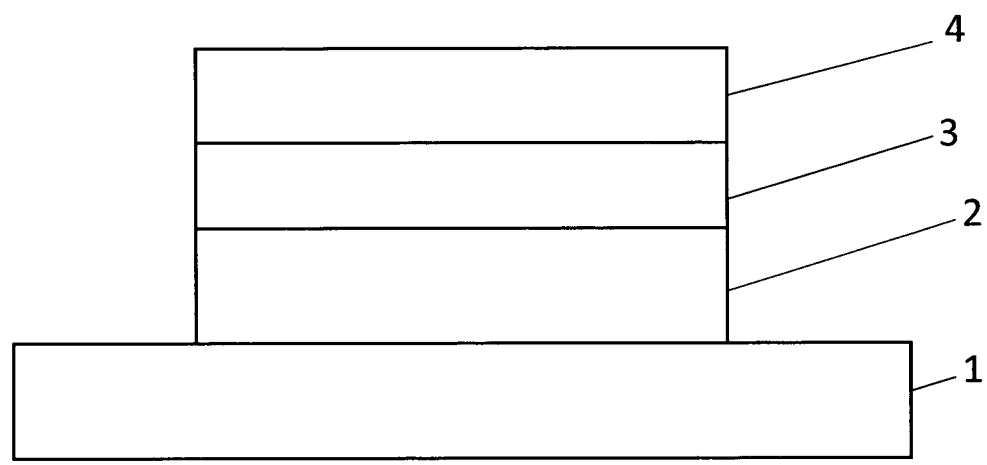
FIG. 11 illustrates a schematic p-MOS device, according to an embodiment.
Figure 12:
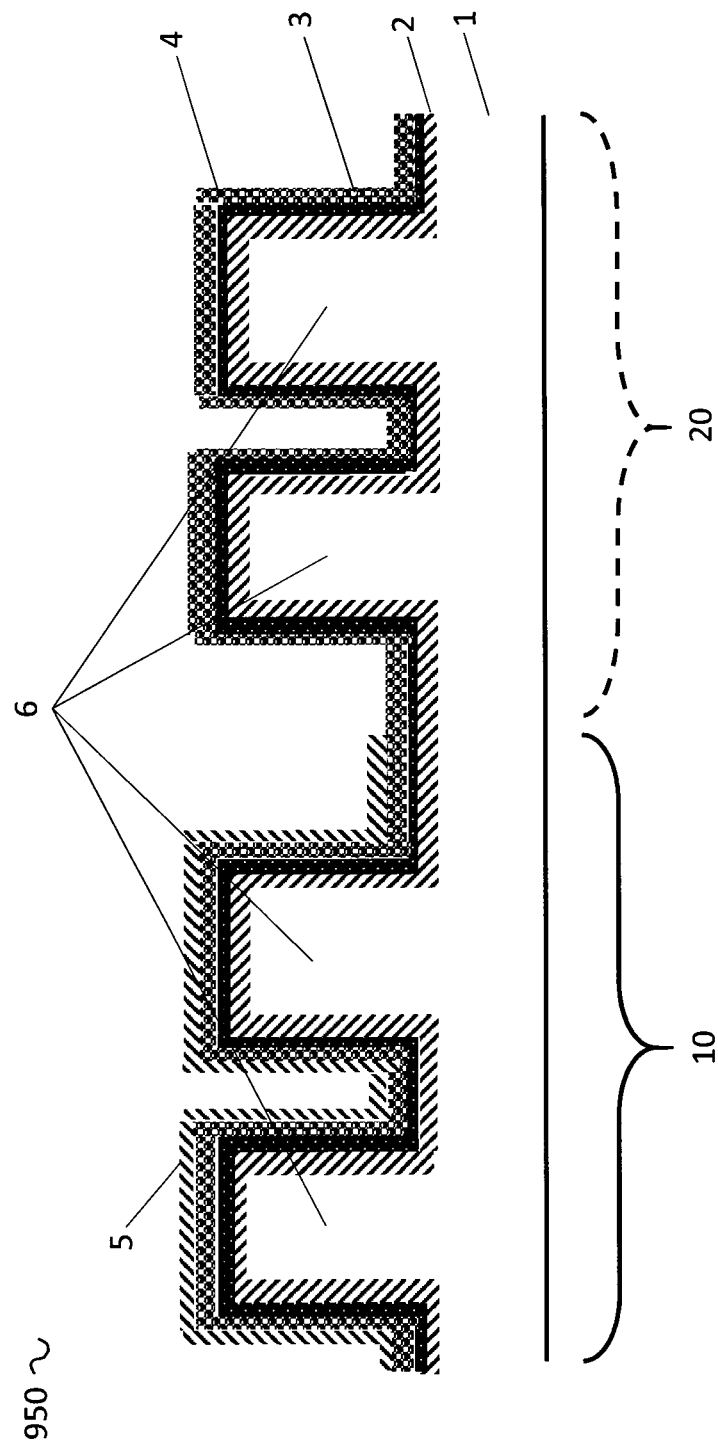
FIG. 12 illustrates a schematic a dual work function field effect transistor according to an embodiment.

In the present disclosure, the ALD cycle further comprises yet another pulsing with a Ta-containing precursor gas. The inventors have found out that pulsing with a Ta-containing precursor gas incorporates Ta into this metal during deposition. Thus, pulsing with this Ta containing precursor gas incorporates Ta into the TiN metal electrode, thereby leading to the formation of a $Ti_xTa_yN_z$ layer 4 (FIGS. 8, 11 and 12). The (Ti+Ta)/N atomic ratio, which is equal to (x+y)/z, in $Ti_xTa_yN_z$ is approximately equal to 1. The atomic percentage (z) of N is about 50%, in some embodiments. The atomic percentage (y) of Ta is between about 5 at. % to about 45 at. %, according to embodiments. This is equivalent to say that the atomic percentage (y) of Ta may change from 0.05 to 0.45. Therefore, the composition of the $Ti_xTa_yN_z$ layer 4 may be represented as $Ti_xTa_yN_z$, where x+y=0.5 and x+y+z=1, where x, y and z refer to atomic percentages.

In various embodiments, the semiconductor structure formed as described above comprises a metal-oxide-semiconductor (MOS) device having a metal electrode comprising Ti and Ta as disclosed.

In an embodiment, a MOS device formed using processes described above comprises a p-MOS device 900 (FIG. 11) having the $Ti_xTa_yN_z$ layer 4 as the gate electrode. The high-k dielectric material 3 on which the $Ti_xTa_yN_z$ layer 4 is formed may be, e.g., a suitable high-k dielectric material for p-MOS devices.

In another embodiment, a MOS device formed using processes described above comprises an n-MOS device 850 FIG. 8) and the $Ti_xTa_yN_z$ layer 4 as the gate electrode. A suitable high-k dielectric material that lies under and in contact with this gate electrode and adapted for n-MOS devices can be used in the n-MOS device. In this particular embodiment, the method further comprises forming, on, e.g., directly on, the $Ti_xTa_yN_z$ gate electrode layer 4 of the n-MOS device 850, an Al-comprising metal 5, e.g., an alloy of Ti and Al. In some embodiments, an alloy of Ti and Al can be $Ti_qAl_{1-q}$, where 0<q<1. In some embodiments, the Al-comprising metal can be a $Ti_qAl_{1-q}$ layer having a thickness between about 4 nm and about 6 nm, e.g., about 5 nm. In other embodiments, the Al-comprising layer can be greater than or less than about 5 nm.

The effective work function (EWF) of a $Ti_xTa_yN_z$ layer formed as described herein, without an Al-comprising layer formed thereon, can be as high as some state-of-the-art TiN (~4.76 eV), which can be suitable as a gate electrode for a p-MOS device. By forming an Al-comprising layer, e.g., $Ti_qAl_{1-q}$, on $Ti_xTa_yN_z$, the EWF of $Ti_xTa_yN_z/Ti_qAl_{1-q}$ stack can be made sufficiently lower and suitable as a gate electrode for an n-MOS device. That is, by using the $Ti_xTa_yN_z$ layer with and without an Al-comprising layer, e.g., $Ti_qAl_{1-q}$ formed thereon, a gate electrode for an n-MOS device and a p-MOS device can be formed, respectively.

Figure 2:
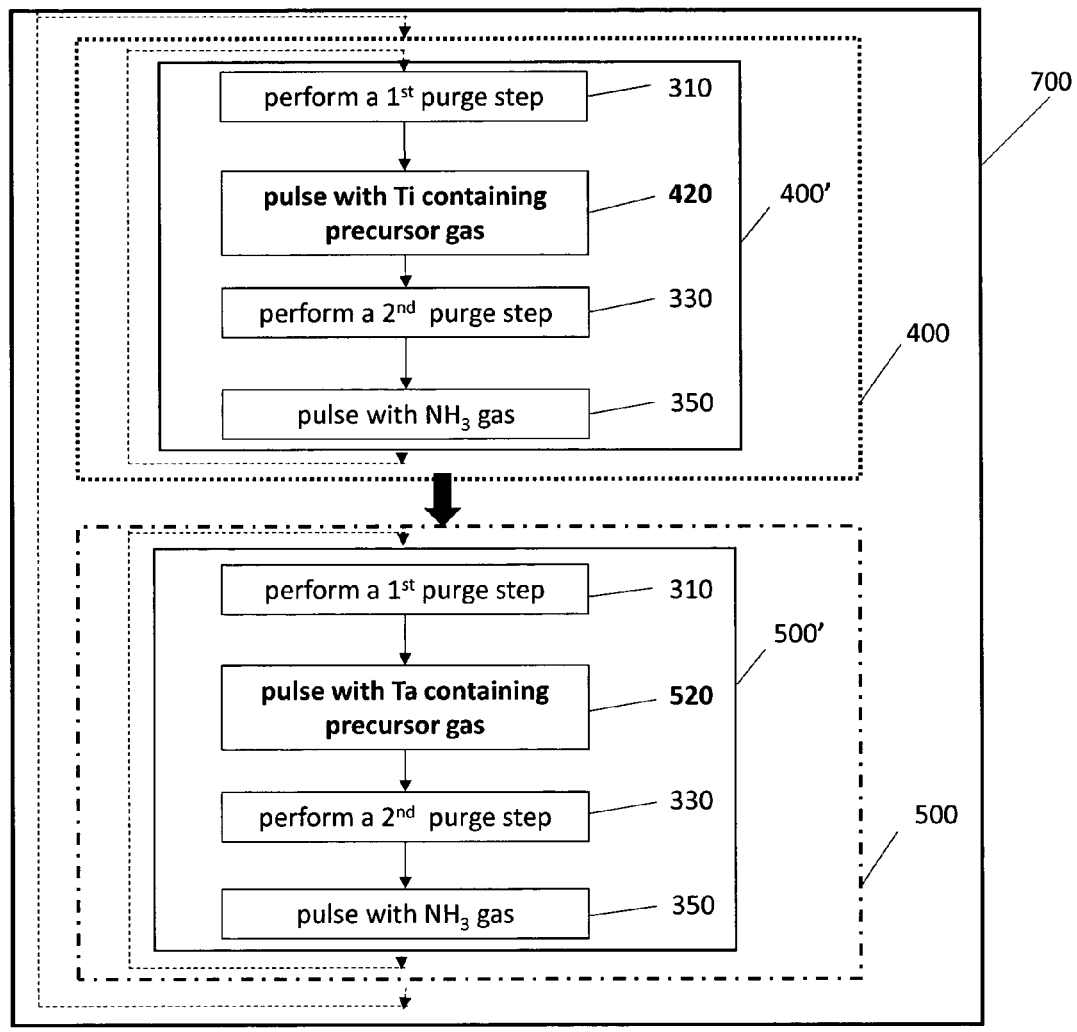
FIG. 2 is a flowchart illustrating a process of the method illustrated in FIG. 1.

FIG. 2 is a flowchart representing a process of the method of forming a metal represented in the flowchart of FIG. 1. In particular, FIG. 2 illustrates in detail the process of depositing 700 a metal by performing an ALD cycle.

The ALD cycle 700 performed to deposit $Ti_xTa_yN_z$ comprises or consists of a first sub-cycle 400 and a second sub-cycle 500, according to various embodiments.

The first sub-cycle 400 can be used to form TiN. The first sub-cycle comprises or consists of a first unit cycle 400' that can be repeated a plurality of times within the first sub-cycle (400). The first unit cycle 400' starts with a first purge process 310. This first purge process 310 can be performed using an inert gas such as Ar gas or $N_2$. Subsequently in a next process 420, a Ti-containing precursor gas is pulsed. A suitable Ti-containing precursor gas may be $TiCl_4$, $TiF_4$, $TiBr_4$ or a metal-organic precursor of Ti or a combination thereof, according to embodiments.

Still referring to FIG. 2, a third process 330 of the unit cycle 400' includes a second purge process 330, which can be performed using the same inert gas used in process 310, or a different inert gas. The unit cycle 400' further includes a fourth process, which can be the last process 350 of the first unit cycle 400', in which a nitrogen-containing gas, e.g., $NH_3$, gas is pulsed. In various embodiments, the first unit cycle 400' can be performed a predetermined first number of times (n>1 or n=1) (see dotted line), which completes the first sub-cycle 400.

Still referring to FIG. 2, subsequent to the first sub-cycle 400, a second sub-cycle 500 is performed. The second sub-cycle can be used to incorporate Ta in the underlying TiN-containing layer formed during the first sub-cycle. The second sub-cycle 500 comprises or consists of a second unit cycle 500' that can be repeated. The second unit cycle 500' is initiated by a first process 310 of performing a first purge process, which can be the same as process 310 of this first unit cycle 400'. Subsequently, Ta-containing precursor gas is pulsed in a second process 520. A suitable Ta-containing precursor gas may be $TaCl_5$, $TaF_5$, $TaBr_5$ or a metal-organic precursor of Ta or a combination thereof.

Still referring to FIG. 2, a third process 330 includes a second purge process, which can be performed using the same inert gas as that used in process 330 of this first unit cycle 400'. The fourth process 350, which can be the last process of the second unit cycle 500', includes pulsing with a nitrogen-containing gas, e.g., $NH_3$ gas. Repeating this second unit cycle 500' for a predetermined second number (see dotted line) of times (m>1 or m=1) completes this second sub-cycle 500.

In the illustrated embodiment, the first sub-cycle 400 is performed prior to performing the second sub-cycle 500.

Alternatively, the reverse order in which the second sub-cycle 500 may be performed prior to performing this first sub-cycle 400.

In some embodiments, the deposition rate of both TiN and TaN is roughly equal, e.g., 0.04 nm per unit cycle 400', 500'. The thickness of $Ti_xTa_yN_z$ obtained per ALD cycle 700 is determined by multiplying this deposition rate of 0.04 nm/(unit cycle) by the summation of the first number of times n (which is used to repeat the first unit cycle to make up the first sub-cycle, TiN deposition) and the second number of times (m) (which is used to repeat the second unit cycle to make up the second sub-cycle, TaN deposition). Eventually, the (final) thickness of $Ti_xTa_yN_z$ depends on the predetermined number of times (p) that the ALD cycle 700 has to be repeated.

Continuing with the example above, if one uses a first sub-cycle 400 for TiN deposition with the first unit cycle 400' repeated only once (n=1) and a second sub-cycle 500 for TaN deposition with the second unit cycle 500' repeated for 4 times (m=4), then one obtains a thickness of 0.2 nm $Ti_xTa_yN_z$ per ALD cycle 700 (=0.04 nm/cycle)×(1+4)). Repeating this ALD cycle 700, for example, for a predetermined times of 5 (p=5), results in a (final) $Ti_xTa_yN_z$ thickness of 1 nm.

Preferably, the (final) thickness of the $Ti_xTa_yN_z$ metal layer is in the range of 1.0 nm to 2.0 nm for a n-MOS or a p-MOS device.

It will be appreciated that the duration of a pulse cycle can be proportional to the degree of surface saturation by the pulsed precursor, until the surface is saturated with the precursor. In some embodiments, the desired thickness of the $Ti_xTa_yN_z$ layer may be controllably obtained by optimizing, e.g., shortening the duration of the pulses within this first unit cycle 400' and/or within this second unit cycle 500'. By doing so the deposition rate per cycle (i.e. nm deposited/cycle) will be adjusted, e.g., reduced, and consequently, the number of times that this first sub-cycle 400 and/or this second sub-cycle 500 is repeated may need to be increased along with an increase in predetermined number of times (p) of the ALD cycle 700. However, while adjusting the number of times that this first unit cycle, this second unit cycle and/or this ALD cycle have to be performed, care must be taken to achieve an optimum Ta percentage in the final $Ti_xTa_yN_z$ layer such that the desired tuning of EWF can be achieved.

However, when the reaction is in a saturation regime, increasing the pulse duration will not increase the deposition rate (i.e. nm deposited/cycle).

It is an advantage of this method that deposition of $Ti_xTa_yN_z$ using the ALD cycle 700 comprising or consisting of this first sub-cycle 400 and this second sub-cycle 500 as illustrated in FIG. 2, leads Ta to blend within TiN rather than obtaining an alternating TiN/TaN laminate. That is, a given monolayer of the $Ti_xTa_yN_z$ has both Ti and Ta atoms. As used herein, a monolayer is defined as an ultra-thin layer having a vertical thickness in which on average, approximately one molecular unit of the $Ti_xTa_yN_z$ is present across the ultra-thin layer.

Approximately, the Ti/Ta ratio may be taken as the ratio of first number of times of the TiN unit cycle 400' divided by second number of times of TaN unit cycle 500' (n/m). In the example above, the TiN/TaN ratio, thus, the Ti/Ta ratio, which can also be represented by (x/y), would be ¼. This means 10% Ti and 40% Ta in the final $Ti_xTa_yN_z$ layer. This is also equivalent to say that this $Ti_xTa_yN_z$ layer is made up by about 10% TiN and about 40% TaN.

$TiCl_4$ and $TaCl_5$ are precursor gases that can be used for ALD deposition in these embodiments. They are compatible with each other in terms of reaction temperature. In some embodiments, the ALD cycle 700 is a thermal ALD cycle which does not utilize a plasma reaction. In other embodiments, the ALD cycle 700 is a plasma ALD cycle which utilizes a plasma reaction. In some embodiments, the ALD cycle 700 is hence preferably performed using $TiCl_4$ and $TaCl_5$ precursor gases at a temperature in the range of 200° C. to 550° C. Preferably, this temperature range is 400° C. to 500° C. The ALD chamber pressure during this ALD cycle is in the range of 1 Torr to 25 Torr. The duration of $TiCl_4$, $TaCl_5$ and $NH_3$ pulses are in the range of 50 to 9000 milliseconds (ms). The duration of these pulses have a secondary impact on the Ti/Ta ratio. However, the duration of these pulses are more important to tune the non-uniformity of Ti/Ta ratio over the (complete) surface it is deposited. This (complete) surface may refer to the surface of a wafer. Ar pulse used in the purge processes depends on the reactor design, however typically it has a duration in the range of 300 to 3000 milliseconds.

Figure 3:
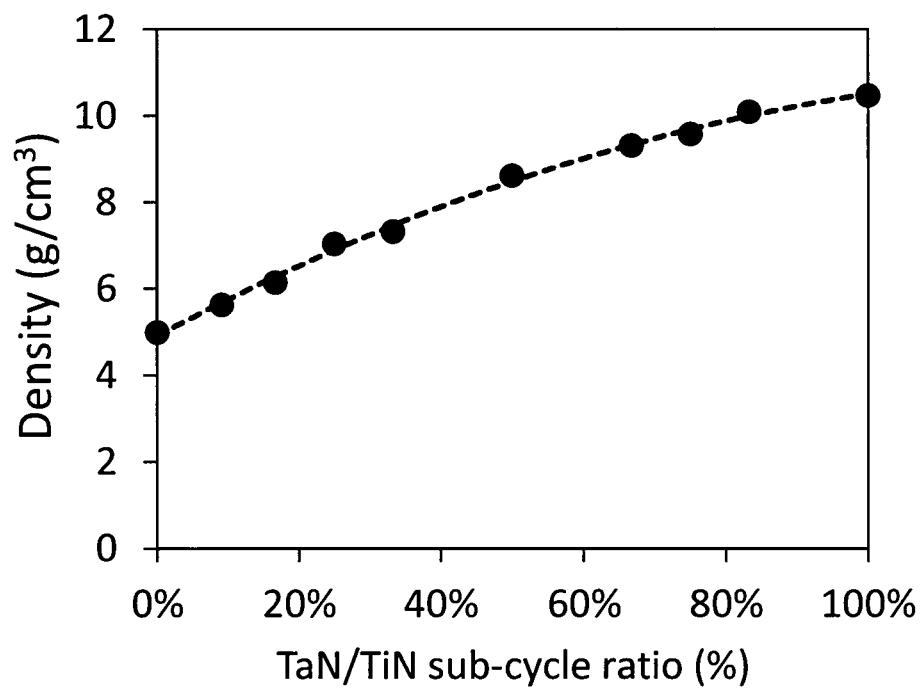
FIG. 3 is a graph illustrating the density (g/cm$^3$) of Ti$_x$Ta$_y$N$_z$ as a function of TaN/TiN sub-cycle ratio, according to an embodiment.

FIG. 3 shows an example of the change of density of this $Ti_xTa_yN_z$ as a function of the TaN/TiN sub-cycle ratio (m/n), which is expressed as the ratio of number of repetition times (m) of the second unit cycle 500' within the second sub-cycle 500 to the number of repetition times (n) of the first unit cycle 400' within the first sub-cycle 400. This figure demonstrates how the density increases by increasing the (m/n) ratio.

Preferably $Ti_xTa_yN_z$ is formed on a hafnium oxide high-k dielectric layer, such as $HfO_2$. However, any high-k dielectric material suitable for use in a MOS device may be used.

Figure 4:
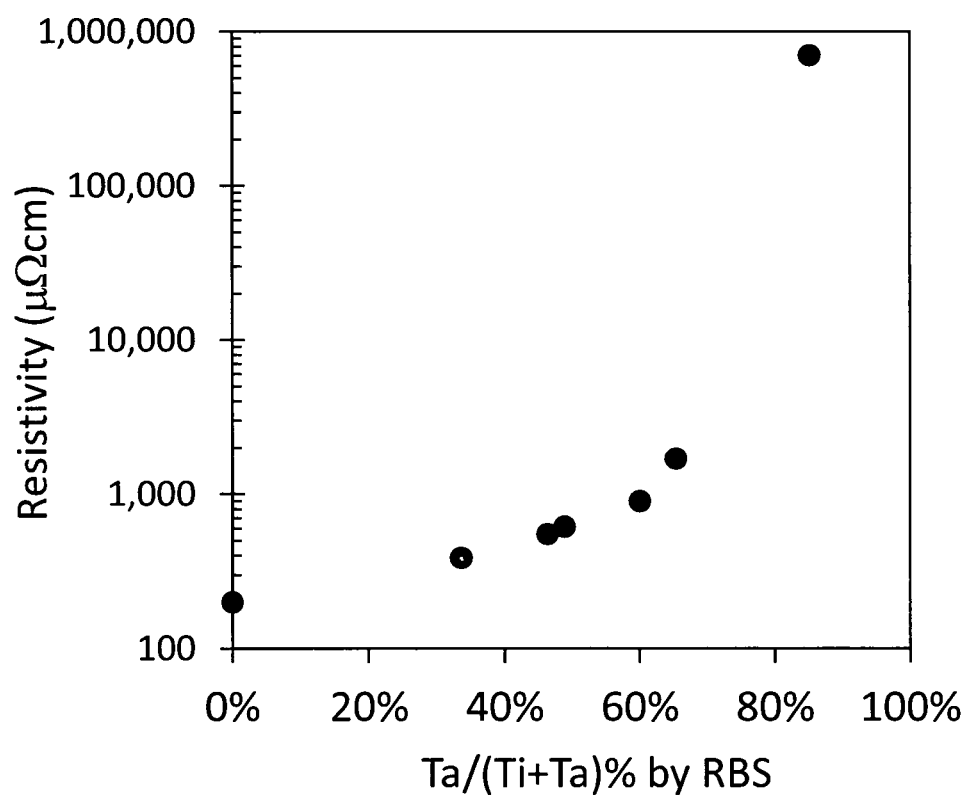
FIG. 4 is a graph illustrating the resistivity (μΩ·cm) of (as deposited) Ti$_x$Ta$_y$N$_z$ as a function of Ta/(Ti+Ta) ratio, according to an embodiment.

FIG. 4 shows an example of the change of resistivity of $Ti_xTa_yN_z$ (μΩ/cm) as a function of Ta/(Ti+Ta) ratio. This Ta/(Ti+Ta) ratio has been calculated by making use of the Ta percentage obtained on $Ti_xTa_yN_z$ by Rutherford Backscattering Spectroscopy (RBS). It is observed that as the Ta/(Ti+Ta) ratio increases from about 0% to about 85%, the resistivity of the as-deposited TixTayNz increases from about $2.0 \times 10^2$ to about $1.0 \times 10^6$ μΩcm.

Figure 5:
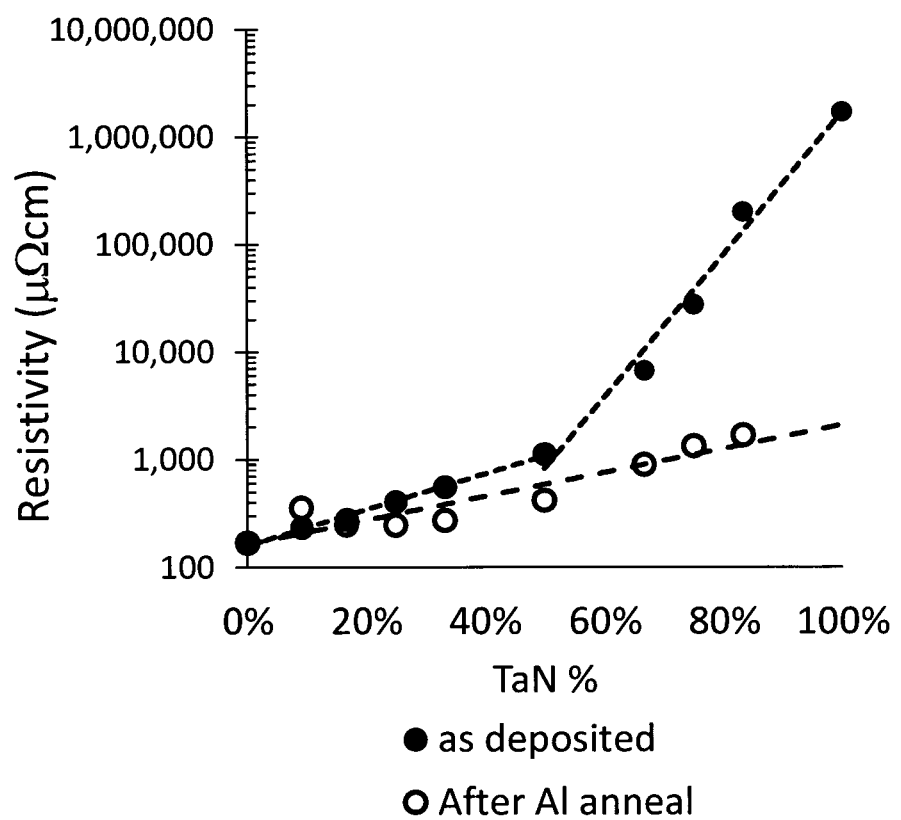
FIG. 5 is a graph illustrating resistivity (μΩ·cm) of Ti$_x$Ta$_y$N$_z$ as a function of the TaN percentage after deposition of Al on Ti$_x$Ta$_y$N$_z$ and subsequent anneal at 500° C., according to an embodiment.

The Ta percentage in $Ti_xTa_yN_z$ also influences the resistivity of $Ti_xTa_yN_z$. This is shown in FIG. 5. The thickness of $Ti_xTa_yN_z$ is in the range of 15 nm to 20 nm and it is formed on $HfO_2$. The TaN percentage as presented in this figure may be viewed as being equivalent to the Ta/(Ti+Ta) ratio or half the Ta percentage in $Ti_xTa_yN_z$. Thus, at a Ta percentage of 25 at. %, there is a kink in this resistivity plot. 25% Ta is obtained in $Ti_xTa_yN_z$ when the first number (n) of unit cycles 400' within the first sub-cycle 400 that belongs to TiN equals the second number (m) of unit cycles 500' within the second sub-cycle 500 that belongs to TaN. Ta percentages in $Ti_xTa_yN_z$ that are less than 25% are obtained when the first number (n) of unit cycles 400' within the first sub-cycle 400 that belongs to TiN is higher than the second number (m) of unit cycles 500' within the second sub-cycle 500 that belongs to TaN. On the contrary, Ta percentages in $Ti_xTa_yN_z$ that are higher than 25% are obtained when the first number (n) of unit cycles 400' within the first sub-cycle 400 that belongs to TiN is less than the second number (m) of unit cycles 500' within the second sub-cycle 500 that belongs to TaN.

X-Ray Diffraction (XRD) has been performed for phase identification and microstructure characterization of as-deposited $Ti_xTa_yN_z$ layer. The results (not shown) indicate that $Ti_xTa_yN_z$ having Ta percentages less than 25 at. % exhibit cubic phase, while $Ti_xTa_yN_z$ having Ta percentages higher than 25 at. % indicate, possibly, orthorhombic phase. The change in microstructure is reflected as a kink at the Ta content of 25 at. % in the resistivity plot given in FIG. 5.

For an n-MOS device, a layer of $Ti_qAl_{1-q}$ is provided on the $Ti_xTa_yN_z$ layer. In the absence of $Ti_qAl_{1-q}$ the EWF is still as high as for TiN (~4.76 eV) In $Ti_qAl_{1-q}$ q represents atomic percentage and is in the range of 0 to 90 at. %. Preferably, q is in the range of 20 at. % to 70 at. %. More preferably, q is in the range of 25 at. % to 40 at. %. In principle it is desired to have the value of "q" of $Ti_qAl_{(1-q)}$ is such that the total thickness of the $Ti_xTa_yN_z/Ti_qAl_{(1-q)}$ stack is as thin as possible for the desired value of EWF. Depending on the value of "q" of $Ti_qAl_{(1-q)}$, this can be achieved by, for example, varying the thickness of $Ti_xTa_yN_z$ and/or atomic percentage of Ta. Alternatively or along with this option, it can also be achieved by providing a thin $Ti_qAl_{(1-q)}$ layer.

FIG. 5 further presents the change of resistivity of a $Ti_xTa_yN_z$ layer having differing Ta percentage, presented as TaN %, when a layer of Al is deposited on the $Ti_xTa_yN_z$ and a thermal anneal is performed after the Al deposition on the $Ti_xTa_yN_z$. This thermal anneal is performed at a temperature of 500° C. for a duration of 4 hours under nitrogen ($N_2$) atmosphere. The purpose of this anneal is to demonstrate directly the change in resistivity by diffusing Al into thick (of about 20 nm) $Ti_xTa_yN_z$. The change of resistivity on 2 nm thick $Ti_xTa_yN_z$ layers by annealing with a layer of $Ti_qAl_{1-q}$ on top can only be measured correctly in an indirect way. Resistivity improvements on such thin $Ti_xTa_yN_z$ are likely to appear at lower temperatures and shorter annealing times.

It is observed from FIG. 5 that the resistivity of $Ti_xTa_yN_z$ is reduced for Ta rich $Ti_xTa_yN_z$, where the second number (m) of unit cycles within the second sub-cycle that belongs to TaN is higher than the first number (n) of unit cycles within the first sub-cycle that belongs to TiN. This decrease in resistivity of $Ti_xTa_yN_z$, where the Ta percentage in $Ti_xTa_yN_z$ is higher than 25%, is highly likely to be due to Al diffusion into $Ti_xTa_yN_z$. XRD results indicate the presence of tetragonal phase for these $Ti_xTa_yN_z$ layers.

Without wishing to be bound by theory, it can be stated that the total gate resistance will, highly likely, be dominated by what is deposited on top of $Ti_xTa_yN_z$ during the manufacturing of n-MOS or p-MOS devices and not by the resistivity of $Ti_xTa_yN_z$ since the thickness of $Ti_xTa_yN_z$ is in the range of 0.5 nm to 3.0 nm and preferably, between 1.5 nm to 2 nm. It should be noted that the resistivity of $Ti_xTa_yN_z$ is improved by diffusion of Al from the $Ti_qAl_{(1-q)}$ present on top of it. Therefore, if $Ti_xTa_yN_z$ layer results in a high resistivity, this problem will be solved both for n-MOS and p-MOS in the "n-MOS first" approach which is explained in a method claim described in order to obtain what is shown in FIG. 12.

Figure 6:
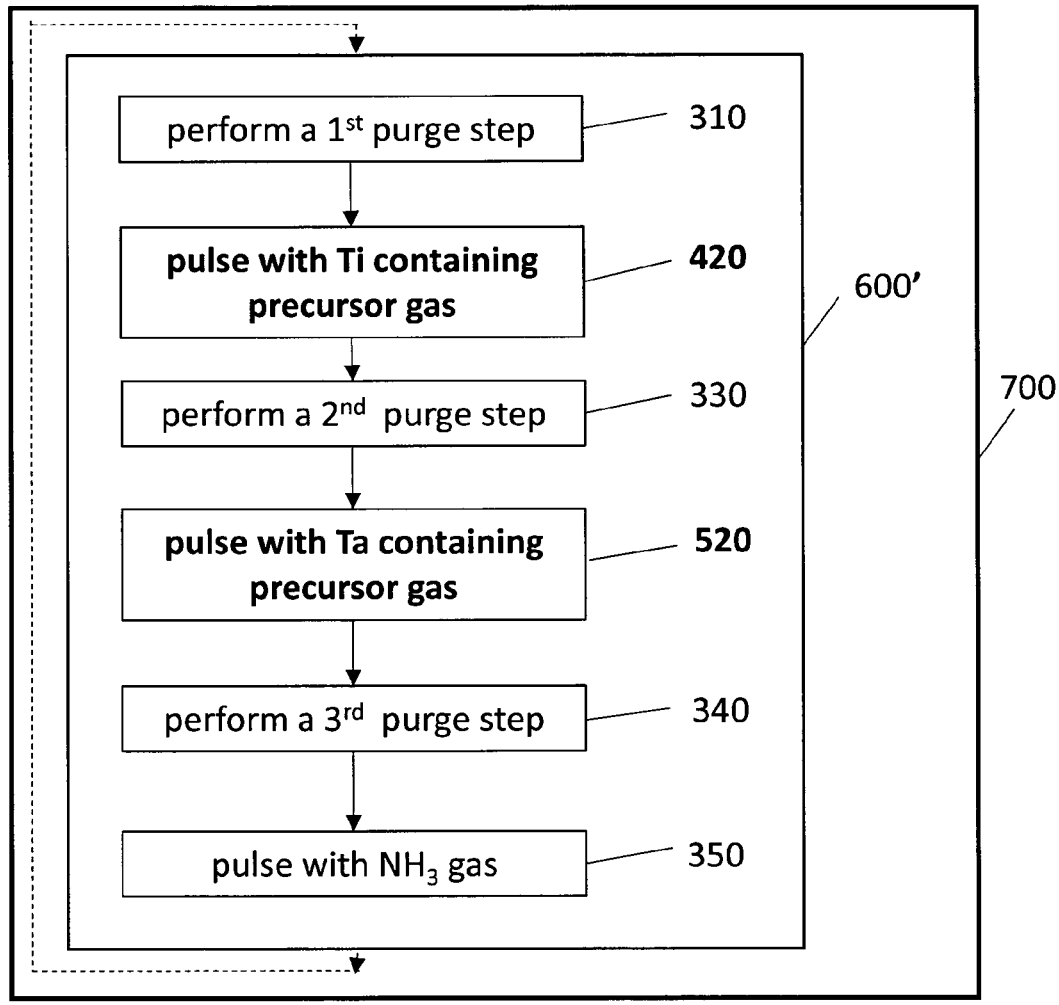
FIG. 6 is a flowchart illustrating an alternative of a process of the method illustrated in FIG. 1, according to an embodiment.

FIG. 6 is a flowchart representing an alternative of a process of the method represented in the flowchart of FIG. 1. According to this alternative, the ALD cycle 700 performed to deposit $Ti_xTa_yN_z$ comprises or consists of a single unit cycle 600'. Repeating this single unit cycle (600') for a predetermined number of times (s) (see dotted line) leads to a $Ti_xTa_yN_z$ layer having the desired thickness.

In the ALD cycle 700 of FIG. 6, the single unit cycle 600' is initiated by performing a first purge process 310. This first purge process is performed by using Ar gas. In a second process 420 of this single unit cycle, a Ti-containing precursor gas is pulsed. The process 430 is followed by a second purge process 330 using an inert gas, e.g., Ar. In the fourth process 520 of the single unit cycle 600', a Ta-containing precursor gas is pulsed. Subsequently, a third purge process 340 is performed using an inert gas, e.g., Ar gas, and in the final process 350 of this single unit cycle 600' $NH_3$ gas is pulsed. Thus, in the ALD cycle 700 of FIG. 6, in contrast to the ALD cycle 700 of FIG. 2, an intervening nitrogen-containing gas, e.g., $NH_3$, is not pulsed between pulsing 420 of the Ti-containing precursor and pulsing 520 of the Ta-containing precursor.

In the ALD cycle consisting of this single unit cycle as represented in FIG. 6, pulsing with Ti-containing precursor gas is always performed before pulsing with Ta-containing precursor gas. This means that process 420 and process 520 as shown in FIG. 5, cannot be swapped. Swapping would result in a TaN layer and not in a $Ti_xTa_yN_z$ layer, at least when $TaCl_5$ is used as the Ta containing precursor and $TiCl_4$ is used as the Ti containing precursor. This is due to the fact that $TiCl_4$ will not react with $TaCl_5$.

FIG. 7 presents an example of the change in sheet resistance (Ohms/square) of $Ti_xTa_yN_z$ when it is deposited using varying pulse durations of the $TaCl_5$ precursor gas and of the $TiCl_4$ precursor gas. $Ti_xTa_yN_z$ is deposited at a thickness of 6.4 nm in order to tangibly study the influence of the change in $TiCl_4$ and in $TaCl_5$ pulse durations on the $Ti_xTa_yN_z$ resistance.

Figure 7B:
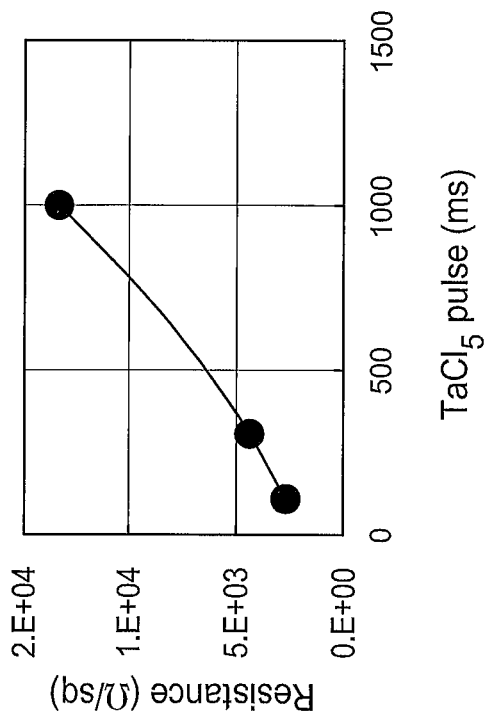
FIG. 7(a) and FIG. 7(b) illustrate the resistance change (Ω/sq.) of 6.4 nm thick Ti$_x$Ta$_y$N$_z$ layer as a function of the pulse duration (ms) of (a) TiCl$_4$ precursor gas, where TaCl$_5$ pulse duration is held constant at 1000 ms (milliseconds), and (b) TaCl$_5$ precursor gas, where the TiCl$_4$ pulse duration is held constant at 100 ms, according to an embodiment.
Figure 7A:
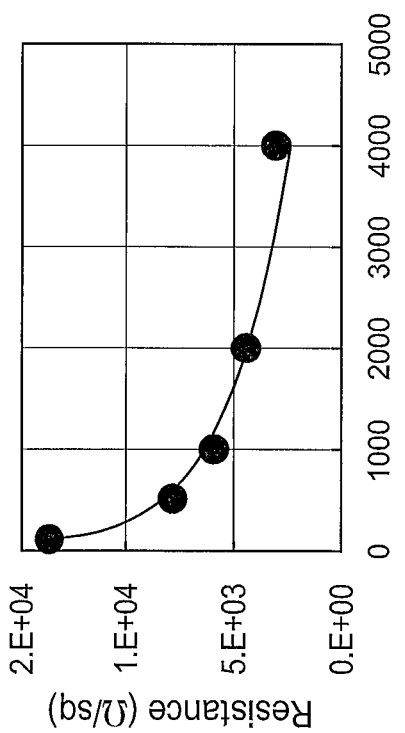

FIG. 7(a) presents an example of the sheet resistance (Ohms/square) change as a function of the $TiCl_4$ precursor gas pulse duration (ms) when the $TaCl_5$ precursor gas duration is fixed at 1000 ms. It is observed that for increasing pulse duration of $TiCl_4$ from 0 ms to 4000 ms, the sheet resistance is decreased from $2.0 \times 10^4$ Ohm/square to less than $5.0 \times 10^3$ Ohm/square. FIG. 7(b) presents the sheet resistance change (Ohm/square) as a function of the $TaCl_5$ pulse duration (ms) when $TiCl_4$ duration is fixed at 100 ms. For increasing pulse duration from 0 ms to 1000 ms, the sheet resistance is increased from a value less than $5.0 \times 10^3$ Ohms/square to a value less than $2.0 \times 10^4$ Ohms/square. These results indicate that fine-tuning of the Ta percentage in $Ti_xTa_yN_z$ can be desirable for adjusting the sheet resistance of $Ti_xTa_yN_z$.

It has been observed that best uniformity in the effective work function of a n-MOS device is obtained when such an ALD cycle consisting of this single unit cycle 600' is performed. Uniformity in effective work function refers to the effective work function of n-MOS devices across the whole wafer. It has been observed that the threshold voltage $V_t$ of a n-MOS device can further be tuned by varying the pulse duration of $TaCl_5$ precursor gas and $TiCl_4$ precursor gas, respectively.

In a second aspect, this disclosure relates to a MOS device 850, 900.

This MOS device may be a MOS capacitor or a MOS transistor. This MOS device comprises a semiconductor structure 1, comprising a semiconductor substrate. This semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium. A dielectric is present at least on a region of this semiconductor structure. This dielectric may be a dielectric stack 2,3 that comprises at least a layer 3 of a dielectric material having a dielectric constant higher than $SiO_2$ (i.e., k>3.9). This dielectric material is a high-k dielectric material. An interfacial layer 2 may be comprised in this dielectric stack 2,3. This interfacial layer 2 is present between this high-k dielectric material 3 and this semiconductor structure 1. Presence of such an interfacial layer is preferable when said at least region of this semiconductor structure 1 on which this dielectric stack is deposited, comprises Si. This interfacial layer 2 then improves the interface properties of this high-k dielectric material with the Si semiconductor structure 1. Improvement of the interface properties has influence on the final device performance. This interfacial layer may, for example, be $SiO_2$ or a $SiO_2$-like layer. The thickness of this interfacial layer is in the range of 0.5 nm to 4 nm. Preferably, it is between 0.5 nm to 1 nm. This high-k dielectric material may, for example, be $HfO_2$. An metal electrode 4 is present on this dielectric 3. Preferably, this metal electrode is in direct contact with this dielectric. More preferably, this metal electrode is in contact with this high-k dielectric material. Alternatively, a TiN layer may be present in between and in contact with this high-k dielectric material and this metal electrode. This metal electrode is $Ti_xTa_yN_z$, wherein x+y+z=1. Preferably, x+y is about 0.5 for a thickness of 2 nm. The Ta percentage can be tuned within the range of 5 at. % to 45 at. % according to the effective work function desired to be obtained.

Alternatively, a TaN layer may be present on and in contact with this $Ti_xTa_yN_z$ metal electrode.

This MOS device may be an n-MOS device 850 or a p-MOS device 900.

In an embodiment, as illustrated in FIG. 8, this MOS device is an n-MOS device 850 and this metal electrode is a gate electrode 4. This n-MOS device may be a n-MOS capacitor or a n-MOS transistor. This n-MOS device further comprises an Al-comprising metal 5, preferably directly on this gate electrode 4. This gate electrode and this Al comprising metal may be referred to as the gate stack of this n-MOS device.

In an embodiment, this Al comprising metal 4 is an alloy of Ti and Al. This alloy is preferably $Ti_qAl_{1-q}$. This $Ti_qAl_{1-q}$ is deposited on the $Ti_xTa_yN_z$ gate electrode 4 to reduce the EWF because the EWF of $Ti_xTa_yN_z$ is still as high as TiN (4.76 eV).

Figure 9:
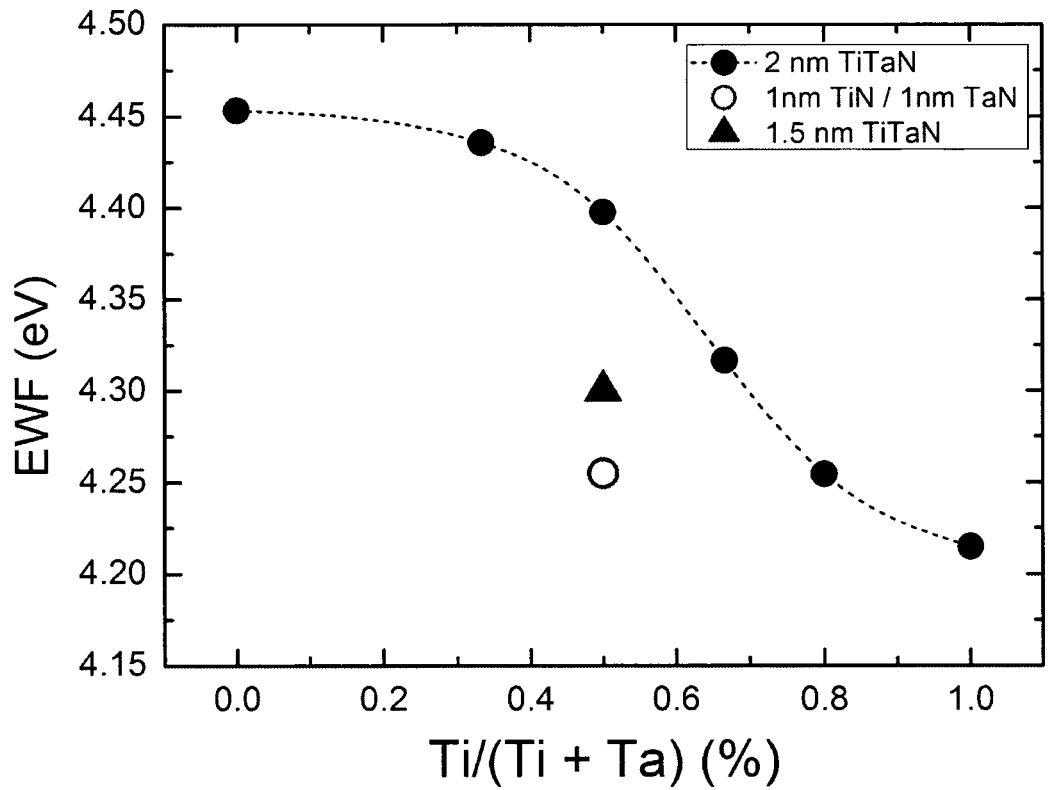
FIG. 9 is a graph illustrating effective work function (EWF (eV)) as a function of the Ti/(Ti+Ta) ratio, according to an embodiment.

The inventors have observed that EWF of $Ti_xTa_yN_z/Ti_xAl_{1-x}$ stack can be tuned by changing the Ta percentage in $Ti_xTa_yN_z$. FIG. 9 shows the EWF tuning of $Ti_xTa_yN_z/Ti_qAl_{1-q}$ stack of an n-MOS device as a function of Ta percentage, which is reflected as Ti/Ti+Ta ratio in the x-axis.

As Ti/(Ti+Ta) ratio is increased, the EWF of this stack is reduced. The typical thickness of the $Ti_xTa_yN_z$ layer is about 2 nm. The thickness of the $Ti_qAl_{1-q}$ layer on top is about 5 nm. The EWF of such a $Ti_xTa_yN_z/Ti_qAl_{1-q}$ stack of an n-MOS device can be tuned by adjusting the Ta percentage in $Ti_xTa_yN_z$. It is observed that a reduced EWF is obtained in the prior art when about 1 nm TiN is used in combination with about 1 nm TaN. On the other hand, using, for example, 2 nm $Ti_xTa_yN_z$, having Ti/(Ti+Ta) ratio of 0.5, overcomes this problem of severe reduction in EWF.

Furthermore, a thinner $Ti_xTa_yN_z$, for example 1.5 nm, having a Ti/(Ti+Ta) ratio of 0.5 may be used compared to a prior art 1 nm TiN/1 nm TaN stack of typical n-MOS devices. This is an advantage thanks to using a $Ti_xTa_yN_z$ layer for future scaling of CMOS technology, especially when replacement metal gate (RMG) route is used for the manufacturing of FinFETs as it allows reducing the thickness of the gate stack.

The inventors have further observed that the gate leakage current ($J_g$) of this n-MOS device has been improved when a $Ti_xTa_yN_z/Ti_qAl_{1-q}$ gate stack is used. This is likely because $Ti_xTa_yN_z$ is a more effective barrier against Al diffusion than a TiN/TaN stack, which is used in state-of-the-art n-MOS devices. Evidence of equivalent oxide thickness (EOT) and interface state density ($D_{it}$) improvements have been observed for $Ti_xTa_yN_z/Ti_qAl_{1-q}$ stack.

Figure 10B:
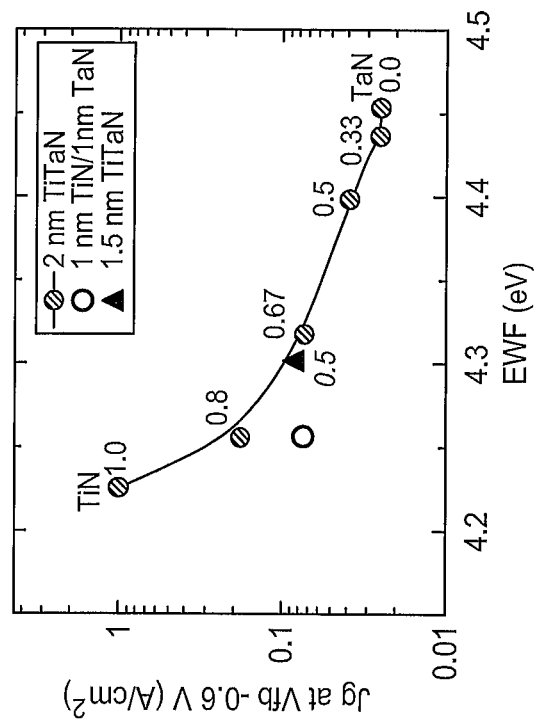
FIG. 10(b) is a graph illustrating gate leakage current (J$_g$) as function of effective work function (EWF (eV)). according to an embodiment.
Figure 10A:
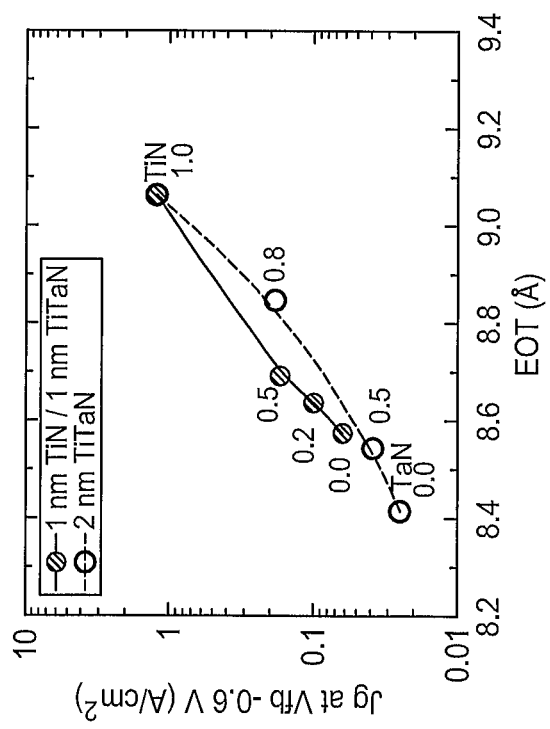
FIG. 10(a) illustrates the gate leakage current (J$_g$) as a function of effective oxide thickness (EOT (angstroms), according to an embodiment.

FIG. 10(a) presents an example of EOT reduction when $Ti_xTa_yN_z$ is used instead of TiN or a TiN/Ti(Ta)N stack. The Ti/(Ti+Ta) ratio of the $Ti_xTa_yN_z$ are indicated. Observing FIG. 10(a) shows that EOT reduction with a reasonable reduction in gate leakage is obtained when the Ti/(Ti+Ta) ratio is reduced. 2 nm thick $Ti_xTa_yN_z$ layers provide a lower EOT and lower gate leakage curent compared to the prior art TiN/TiTaN stack with total thickness of 2 nm and similar Ta concentration in the $Ti_xTa_yN_z$. For example, an n-MOS device having a single 2 nm thick $Ti_xTa_yN_z$ under 5 nm $Ti_qAl_{1-q}$, where x is between 20 at. % and 70 at. %, has a slightly lower EOT and gate leakage current compared to 1 nm TiN/1 nm TaN under the same $Ti_qAl_{1-q}$.

FIG. 10(b) shows an example of the change of gate leakage as a function of EWF obtained for differing Ti/(Ti+Ta) ratio of $Ti_xTa_yN_z$ of $Ti_xTa_yN_z/Ti_qAl_{1-q}$ stack of this n-MOS device. It is observed that, for example, a stack of 1 nm TiN/1 nm TaN (denoted with "o" signs) has a reduced EWF and a higher gate leakage current compared to a 2 nm thick $Ti_xTa_yN_z$ layer having a Ti/Ti+Ta ratio of 0.5. Improved gate leakage current and improved EWF obtained by using $Ti_xTa_yN_z$ is an advantage over a TiN/TaN stack used in state-of-the-art.

Besides, reducing the thickness of $Ti_xTa_yN_z$ to 1.5 nm while preserving the Ti/Ti+Ta ratio of 0.5 provides almost the same gate leakage current as that of the prior art 1 nm TiN+1 nm TaN stack but with an improved EWF providing room for scaling of feature sizes.

In an alternative embodiment, as illustrated in FIG. 11, this MOS device is a p-MOS device 900. This p-MOS device may be a p-MOS capacitor or a p-MOS transistor. In this embodiment, no $Ti_qAl_{1-q}$ is present on top of Ti(x)Ta(y)N gate electrode 4. $Ti_xTa_yN_z$ provides a EWF suitable for the functioning of this p-MOS device.

In an embodiment, such an n-MOS device is comprised in an integrated circuit. This integrated circuit can further comprise such a p-MOS device. The n-MOS device and the p-MOS device both have a layer of $Ti_xTa_yN_z$ having the same composition formed on their respective gate dielectric. Preferably, this layer of $Ti_xTa_yN_z$ having the same composition is formed directly on their respective gate dielectrics. Alternatively, a TiN layer may be present in between and in contact with this layer of $Ti_xTa_yN_z$ and the gate dielectric. The n-MOS device has, preferably, directly on top of this $Ti_xTa_yN_z$ layer a layer of $Ti_qAl_{1-q}$ to tune the work function of the n-MOS device with respect to the p-MOS device.

In a third aspect this disclosure relates to a method for fabricating a dual work function metal gate on a semiconductor structure.

The method comprises providing a semiconductor structure 1). This semiconductor structure may be a field effect transistor (FET) or an intermediate structure in the fabrication of this FET. This intermediate structure may comprise a dummy metal gate or a replacement metal gate. This semiconductor structure comprises a substrate. This semiconductor substrate may be bulk Si, silicon on insulator (SOI), silicon on glass, silicon on sapphire or germanium on insulator (GOI). The semiconductor material of this semiconductor substrate may be germanium, gallium arsenide, gallium arsenide phosphide, indium gallium arsenide, silicon germanium. This semiconductor structure comprises a first region 10 and a second region 20. Each of this first region and second region is covered with a dielectric. This dielectric may further be a dielectric stack 2, 3 comprising at least a layer of a dielectric material 3 having a dielectric constant higher than $SiO_2$. This first region 10 comprises a first dopant. This first region may be an n-MOS region and this first dopant may be phosphorus or arsenic. An n-MOS device is produced in this n-MOS region. The concentration of any of these alternative first dopants is adjusted suitably as known to persons skilled in the art according to the needs of the technology. This second region 20 may be a p-MOS region. A p-MOS device is produced in this p-MOS region. This second dopant may be boron and the concentration of boron is adjusted suitably as known to persons skilled in the art according to the needs of the technology. This semiconductor structure, thus, comprises this n-MOS device and this p-MOS device.

This semiconductor structure is brought into an atomic layer deposition (ALD) chamber. A metal is deposited on this dielectric by performing an ALD cycle 700. Preferably, this metal is deposited directly on this dielectric. Alternatively, a TiN layer may be provided directly on this dielectric prior to depositing this metal. Depositing this metal by ALD is advantageous because a conformal metal layer with reliable thickness control can be provided. This ALD cycle 700 comprises pulsing with a Ti-containing precursor gas 420 and another pulsing with $NH_3$ gas 350. This Ti-containing precursor gas may be $TiCl_4$, $TiF_4$, $TiBr_4$ or a metal-organic precursor of Ti. Preferably, this Ti-containing precursor gas is $TiCl_4$. This ALD cycle further comprises yet another pulsing with a Ta-containing precursor gas 520, thereby forming $Ti_xTa_yN_z$ wherein x+y=1. This Ta-containing precursor gas may be $TaCl_5$, $TaF_5$, $TaBr_5$ or a metal-organic precursor of Ta. Preferably, this Ta-containing precursor gas is $TaCl_5$. This metal is an electrode 4. This electrode is a gate electrode.

Next, an Al-comprising metal 5 is provided on this metal electrode 4). This Al-comprising metal is an alloy of Ti and Al. This alloy is $Ti_qAl_{1-q}$.

Preferably, this Al-comprising metal is provided directly on this metal electrode.

Alternatively, a TaN layer may be provided on this metal electrode prior to providing this Al-comprising metal.

Next, this Al-comprising metal is selectively removed from this second region 20. That is selectively removing $Ti_qAl_{1-q}$ from this p-MOS region. Selectively removing $Ti_qAl_{1-q}$ from this p-MOS region comprises depositing a photoresist over this semiconductor structure. Following a lithography process, this photoresist is retained only on this first region 10, which is this n-MOS region, thereby exposing this p-MOS region. Thereafter, $Ti_qAl_{1-q}$ is selectively removed from this exposed p-MOS region. Stripping this photoresist exposes this $Ti_qAl_{1-q}$ in this n-MOS region.

In a fourth aspect, this disclosure relates to a dual work function metal gate field effect transistor 950 (FIG. 12).

This FET 950 comprises a semiconductor structure 1.

This semiconductor structure 1 comprises a semiconductor substrate. This semiconductor substrate may be bulk Si, silicon on insulator (SOI), silicon on glass, silicon on sapphire or germanium on insulator (GUI). The semiconductor material of this semiconductor substrate may be germanium, gallium arsenide, gallium arsenide phosphide, indium gallium arsenide, silicon germanium. This semiconductor structure may be non-planar and thus, may comprise vertical semiconductor bodies 6 protruding from this substrate. These vertical semiconductor bodies are fin structures 6. These fin structures may comprise Si, strained Si, Ge, or a III-V compound semiconductor material. This semiconductor structure may also be planar.

This FET comprises 950 a first region 10 comprising a first dopant and a second region 20 comprising a second dopant. A dielectric is present overlying both of this first region 10 and this second region 20. This dielectric may be a dielectric stack 2,3. This dielectric comprises at least a layer of a dielectric material 3 having a dielectric constant higher than $SiO_2$ 2. This dielectric material is a high-k material 3. This high-k dielectric material may, for example, be $HfO_2$. An interfacial layer 2 may be comprised in this dielectric stack 2,3. This interfacial layer 2 is present between this high-k dielectric material 3 and this semiconductor structure 1. Presence of such an interfacial layer is preferable when these fin structures 6, on which this dielectric stack is deposited, comprises Si. This interfacial layer 2 then improves the interface properties of this high-k dielectric material with these fin structures 6. Improvement of the interface properties has influence on the final device performance. This interfacial layer may, for example, be $SiO_2$ or a $SiO_2$-like layer. The thickness of this interfacial layer is in the range of 0.5 nm to 4 nm. Preferably, it is between 0.5 nm to 1 nm. An metal electrode 4 is present on this dielectric both on the first region 10 and on the second region 20). Preferably, this metal electrode is present directly on this dielectric both in the first region 10 and on in the second region 20) in contact with this high-k dielectric material. Alternatively, a TiN layer may be present in between this metal electrode and this dielectric both on the first region 10 and on the second region 20.

This metal electrode is $Ti_xTa_yN_z$, wherein x+y+z=1, x+y=0.5 and 0<x, y, z<1. This metal electrode has a thickness of about 2 nm and has a Ta percentage in the range of 5 at. % and 45 at. %. The Ta percentage can be tuned within the range of 5 at. % to 45 at. % according to the effective work function desired to be obtained.

A TaN layer may alternatively, be present directly on this metal electrode $Ti_xTa_yN_z$ both on the first region 10 and on the second region 20.

An Al-comprising metal 5 is present only on this first region 10 on this metal electrode. Preferably, this Al comprising metal is present directly on this metal electrode on this first region 10.

This Al-comprising metal may, alternatively, be present directly on this TaN layer, if present, on this first region 10).

This Al-comprising metal 5 is an alloy of Ti and Al. Preferably, this alloy is $Ti_qAl_{1-q}$. This first region 10 is a n-MOS device region. This first dopant comprised in this first region 10 may be phosphorus or arsenic. This second region 20 is a p-MOS device region. This second dopant comprised in this second region 20 may be boron (B). Concentration of this first dopant and/or second dopant is adjusted accordingly in order to be suitable for the technology in question used for fabricating this transistor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a metal-oxide-semiconductor (MOS) device comprising forming an n-type MOS (n-MOS) device, forming the n-MOS device comprising:

providing a semiconductor substrate at least partially covered with a dielectric;

introducing the semiconductor substrate into a chamber configured for atomic layer deposition (ALD);

depositing a metal electrode on the dielectric by performing an ALD cycle, performing the ALD cycle comprising pulsing a Ti-containing precursor gas followed by pulsing a Ta-containing precursor gas, wherein one or both of pulsing the Ti-containing precursor gas and pulsing the Ta-containing precursor gas comprises partially saturating a deposition surface, performing the ALD cycle further comprising pulsing $NH_3$ gas, wherein the metal electrode is a $Ti_xTa_yN_z$ layer formed of a plurality of $Ti_xTa_yN_z$ monolayers in which each $Ti_xTa_yN_z$ monolayer comprises both Ti and Ta atoms, wherein x+y is about 0.5 and x+y+z is about 1, and wherein x/y ratio is between about 0.1 and about 0.4; and depositing on the metal electrode an Al-comprising metal, wherein depositing the Al-comprising metal forms a metal stack of an n-MOS gate electrode having an effective work function (EWF) below 4.76 eV.

2. The method according to claim 1, wherein each of pulsing the Ti-containing precursor and pulsing the Ta-containing precursor comprises partially saturating the deposition surface, such that a homogeneous metal is formed.

3. The method according to claim 2, wherein the Ti-containing precursor is $TiCl_4$ and the Ta-containing precursor is $TaCl_5$.

4. The method according to claim 3, wherein the ALD cycle is a thermal ALD cycle performed at a substrate temperature between 400° C. and 500° C.

5. The method according to claim 1, wherein the dielectric comprises at least a layer of a high-K dielectric material having a dielectric constant higher than that of $SiO_2$.

6. The method according to claim 1, wherein the method of forming the MOS further comprises forming a p-type MOS (p-MOS) device, wherein forming the p-MOS device comprises depositing a second metal electrode having the same composition as the metal electrode without depositing on the second metal an Al-comprising metal.

7. The method according to claim 6, wherein the Al-comprising metal is an alloy formed of Ti and Al.

8. The method according to claim 1, wherein performing the ALD cycle comprises repeating the ALD cycle for a predetermined number (p) of times.

9. The method according to claim 1, wherein the ALD cycle comprises a first sub-cycle comprising a plurality of first unit cycles repeated for a first number (n) of times, each first unit cycle comprising alternating pulses of the Ti-containing precursor gas and the $NH_3$ gas, wherein the ALD cycle further comprises a second sub-cycle comprising a plurality of second unit cycles repeated for a second number (m) of times, each second unit cycle comprising alternating pulses of the Ta-containing precursor gas and the $NH_3$ gas.

10. The method according to claim 9, wherein pulsing the $NH_3$ gas is performed after pulsing the Ti-containing precursor gas within each first unit cycle, and wherein pulsing the $NH_3$ gas is performed after pulsing the Ta-containing precursor gas within each second unit cycle.

11. A method of forming a metal electrode of a semiconductor structure, the method comprising:

providing a semiconductor substrate at least partially covered with a dielectric;

introducing the semiconductor substrate into a chamber configured for atomic layer deposition (ALD);

depositing a metal on the dielectric by performing an ALD cycle, performing the ALD cycle comprising pulsing a Ti-containing precursor gas followed by pulsing a Ta-containing precursor gas, performing the ALD cycle further comprising pulsing $NH_3$ gas, wherein the ALD cycle comprises a unit cycle comprising pulsing the Ti-containing precursor gas and pulsing the Ta-containing precursor gas without an intervening $NH_3$ gas pulse, and wherein the metal is a $Ti_xTa_yN_z$ layer formed of a plurality of $Ti_xTa_yN_z$ monolayers in which each $Ti_xTa_yN_z$ monolayer comprises both Ti and Ta atoms, wherein x+y is about 0.5 and x+y+z is about 1, and wherein x/y ratio is between about 0.1 and about 0.4, and depositing on the metal an Al-comprising metal, wherein depositing the Al-comprising metal forms a metal stack of MOS gate electrode having an effective work function (EWF) below 4.76 eV.

12. The method according to claim 11, wherein the unit ALD cycle comprises pulsing the Ti-containing precursor before pulsing the Ta-containing precursor gas.

13. The method according to claim 12, wherein pulsing the $NH_3$ gas is performed after pulsing the Ta-containing precursor gas.

14. A metal-oxide-semiconductor (MOS) device comprising an n-type MOS (n-MOS) device, the n-MOS device comprising:

a semiconductor structure formed on a semiconductor substrate;

a dielectric formed at least on a region of the semiconductor structure;

a metal electrode formed on the dielectric, the metal electrode comprising a $Ti_xTa_yN_z$ layer, wherein x+y+z=1, x+y=0.5, x/y ratio is between about 0.1 and about 0.4, and 0<x, y, z<1, and wherein the metal electrode has a thickness between about 1 nm and about 3 nm; and an Al-comprising metal formed on the metal electrode, wherein the Al-comprising metal forms a metal stack of an n-MOS gate electrode having an effective work function (EWF) below 4.76 eV.

15. The MOS device according to claim 14, wherein the dielectric comprises at least a layer of a dielectric material having a high-K dielectric material having a dielectric constant higher than that of $SiO_2$.

16. The MOS device according to claim 14, wherein the $Ti_xTa_yN_z$ layer is a homogeneous $Ti_xTa_yN_z$ layer formed of a plurality of $Ti_xTa_yN_z$ monolayers in which each $Ti_xTa_yN_z$ monolayer comprises both Ti and Ta atoms.

17. The MOS device according to claim 14, wherein the MOS device further comprises a p-type MOS (p-MOS) device, wherein the p-MOS device comprises a second metal electrode having the same composition as the metal electrode without having formed thereon an Al-comprising metal.

18. The MOS device according to claim 17, wherein the Al-comprising metal is formed of an alloy of Ti and Al.

* * * * *